United States Patent [19]
Srikrishnan

[11] Patent Number: 5,882,987
[45] Date of Patent: Mar. 16, 1999

[54] SMART-CUT PROCESS FOR THE PRODUCTION OF THIN SEMICONDUCTOR MATERIAL FILMS

[75] Inventor: Kris V. Srikrishnan, Wappingers Falls, N.Y.

[73] Assignee: International Business Machines Corporation, Armonk, N.Y.

[21] Appl. No.: 920,117

[22] Filed: Aug. 26, 1997

[51] Int. Cl.[6] .................................................. H01L 21/30
[52] U.S. Cl. ..................... 438/458; 438/455; 438/406; 438/407; 438/977; 438/528; 148/DIG. 50
[58] Field of Search .................................. 438/458, 455, 438/406, 407, 528, 977; 148/DIG. 12

[56] References Cited

U.S. PATENT DOCUMENTS

| | | |
|---|---|---|
| 4,601,779 | 7/1986 | Abernathey et al. . |
| 4,735,679 | 4/1988 | Lasky . |
| 5,198,371 | 3/1993 | Li . |
| 5,234,535 | 8/1993 | Beyer et al. . |
| 5,310,451 | 5/1994 | Tejwani et al. . |
| 5,374,564 | 12/1994 | Bruel . |
| 5,510,277 | 4/1996 | Cunningham et al. . |
| 5,714,395 | 2/1998 | Bruel ....................................... 438/528 |

OTHER PUBLICATIONS

Bruel, M., "Silicon on insulator material technology", Electronics Letters, vol. 31, No. 14 (Jul. 6, 1995) pp. 1201–1202.

Moriceau, H., et al., "Cleaning and Polishing as Key Steps for Smart–Cut® SOI Process", Proceedings 1996 IEEE International SOI Conference (Oct. 1996) pp. 152–153.

Aspar, B., et al., "Transfer of structured and patterned thin silicon films using the Smart–Cut® process", Electronics Letters, vol. 32, No. 21 (Oct. 10, 1996) pp. 1985–1986.

*Primary Examiner*—Trung Dang
*Attorney, Agent, or Firm*—Ratner & Prestia; Tiffany L. Townsend

[57] ABSTRACT

A process applicable to the production of monocrystalline films improves on the Smart-Cut® process by using an etch stop layer in conjunction with the Smart-Cut® process. Because of the etch stop layer, no chemical-mechanical polishing (CMP) is required after fabrication. Thus, the thickness and smoothness of the device layer in the fabricated silicon on insulator (SOI) substrate is determined by the uniformity and smoothness of the deposited layers and wet etch selectivity, as opposed to the CMP parameters. Therefore, the smoothness and uniformity of the device layer are improved.

25 Claims, 7 Drawing Sheets

SMART-CUT PROCESS FOR THE PRODUCTION OF THIN SEMICONDUCTOR MATERIAL FILMS

FIELD OF THE INVENTION

The present invention relates in general to a process for the production of thin semiconductor films. In particular, the present invention describes a process applicable to the production of monocrystalline films.

BACKGROUND OF THE INVENTION

It is known that for producing monocrystalline semiconductor films, there are various methods and processes, which are often complex and expensive. Although it is relatively easy to produce polycrystalline or amorphous material films, it is much more difficult to produce monocrystalline films. Among the methods used for producing monocrystalline films are those used for producing silicon on insulator (SOI) substrates, where the aim is to produce a monocrystalline silicon film on a substrate that is electrically insulated from the film.

A conventional SOI wafer cross section is shown in FIG. 1. An insulating layer 15 is formed on a substrate 10. A device layer 20 is formed on the insulating layer 15. SOI wafers are known in microelectronics and are used in special applications, including radiation hardened devices such as static random access memories (SRAMs), and more recently for high performance complementary metal oxide semiconductor (CMOS) and dynamic random access memory (DRAM) applications. SOI wafers are usually manufactured by 1) implanted oxygen (SIMOX) in which oxygen is implanted into silicon and converted into a silicon dioxide ($SiO_2$) buried layer, or 2) wafer bonding and etch-back (BESOI) in which two wafers are bonded with oxide surface layers and one wafer is thinned to leave a thin device layer. For the past few years there has been a growing interest in SOI material technology based on BESOI. In prior art BESOI processes, multi-etch layers have been used to minimize the uniformity and tolerance problems.

Another recent process for producing SOI substrates is the Smart-Cut® process. The Smart-Cut process is described in U.S. Pat. No. 5,374,564, which is hereby incorporated by reference for its teachings on Smart-Cut. It is similar to the BESOI process, but instead of thinning by etching, it uses a hydrogen layer that is implanted prior to bonding, and the bulk silicon is fractured after bonding to leave behind a thin layer. In other words, in the Smart-Cut process, hydrogen implantation and annealing are used to fracture the bulk of the device wafer from the bonded wafers. Chemical-mechanical polishing (CMP) is used to planarize and minimize non-uniformity of the as-cut SOI wafer.

The Smart-Cut process has the following steps: 1) a device wafer is processed to have a device quality surface layer, an oxide layer is provided over the device layer, and a buried hydrogen-rich layer is implanted at a certain depth; 2) a "handle wafer" with an oxide surface is provided; 3) the device wafer is flipped and the oxide surfaces are bonded; 4) the structure is annealed to form connecting voids from hydride formation; 5) the structure is fractured; and 6) the transferred device layer is CMP polished and cleaned.

FIG. 2 is a flow diagram of the process steps for forming an SOI substrate using the Smart-Cut process. FIGS. 3A to 3C are diagrams that illustrate the steps in FIG. 2. A device quality wafer 200 is provided at step 100. The wafer surface is oxidized at step 105 so that it is capped or buffered with a thermally grown $SiO_2$ layer 205 (i.e., a dielectric layer).

The dielectric layer 205 becomes the buried oxide of the SOI structure. Hydrogen ions are implanted at 50 to 150 KeV at step 110 with a dosage of $2\times10^{16}$ to $1\times10^{17}$ ions/$cm^2$ to form a hydrogen-rich layer 210 about 0.5 to 1 $\mu$m below the top surface, as shown in FIG. 3A. The thin silicon layer that will be the device layer is shown as layer 207.

The device wafer 200 and a supporting substrate (a nonimplanted handle wafer) 220 are cleaned in step 115 using conventional cleaning techniques such as the RCA wafer cleaning procedure. The surfaces of the device wafer 200 and the supporting substrate 220 are made hydrophilic and are bonded together at room temperature in step 120, as shown in FIG. 3B. The supporting substrate 220 acts as a stiffener and provides the bulk silicon under the buried oxide in the SOI structure.

In hydrophilic (or "direct") bonding, a hydroxyl group ($OH^-$) is formed on a material surface due to the presence of an electric charge of atoms. Furthermore, several layers of water molecules are formed around hydroxyl groups on the surface. When such two ionic materials each having a sufficiently flat face are attached to each other, they are firmly bonded together through hydrophilic bonding by the hydrogen bond formed among the hydroxyl groups and water molecules. Thus, the flat faces of the ionic materials can be hydrophilic bonded with each other without using adhesives. A subsequent annealing makes the bonding stronger.

A two-phase heat treatment is applied to the two bonded wafers 200 and 220. In step 125, the bonded wafers 200 and 220 are annealed to about 400° to 600° C., which promotes the formation and linkage of regions of brittle silicon hydride. When the hydride regions are completely linked across the wafer, the device wafer 200 is fractured and separated from the bonded stack along the hydride rich plane. The thin silicon layer 207 remains bonded to the support substrate 220, as shown in FIG. 3C. Then, the support substrate 220 with the thin silicon layer 207 (device layer) still bonded to it is annealed at a high temperature (approximately 1000° C.) to promote a stronger bonding between the support substrate 220 and the device layer 207. After splitting, the separated surface of the device usually has a roughness on the order of a few hundred angstroms. A CMP is carried out at step 130 to reduce the roughness of the surface. Thus, despite good control of the thickness allowed by the implantation process, the final thickness uniformity and surface roughness are mainly dependent on the CMP parameters.

One disadvantage of the Smart-Cut process is that the roughness of the as-cut surface requires polishing (e.g., CMP) to smooth the surface. This polishing affects the thickness uniformity of the device layer across the wafer. Thus, the polishing process, while improving roughness, simultaneously creates thickness variation.

Another disadvantage is that it is not easy to obtain very thin device layers (on the order of about $3.9\times10^{-6}$ inch (1000 Å) thick) using the Smart-Cut process because the hydrogen implant and spreading will have a large uncertainty, which necessitates beginning with the formation of a thicker layer and thinning it down to control within a tolerance of a couple of hundred angstroms. However, the roughness of the as-split wafer in the Smart-Cut process is typically in the range of about $3.9\times10^{-7}$ to $7.8\times10^{-7}$ inch (100 to 200 Å). Thus, the Smart-Cut process is not well suited for these thin layer devices.

Other methods of fabricating SOI structures use etch stop or etch selective layers, For example, in some versions of BESOI processing, etch stop layers are used in conjunction with CMP to improve thickness and uniformity control. In the prior art processes, however, etching and etch stop layers are used in addition to CMP, Although the art of producing monocrystalline films is well developed, there remain some problems inherent in this technology, One particular problem is that the final thickness of the device layer and the uniformity are not easily controlled due to polishing to remove surface roughness. Therefore, a need exists for a process that is similar to the Smart-Cut process, but does not suffer from thickness variations due to a polishing operation. There is also a need for a process that is compatible with silicon manufacturing, where uniformity and thickness of the SOI device layer can be selected and controlled independent of the Smart-Cut process.

SUMMARY OF THE INVENTION

In the present invention, an etch stop layer is formed beneath the device layer in the starting substrate. By using the etch stop layer, the need for CMP is avoided and the final device thickness, uniformity, and smoothness are based upon the deposited film. The etch stop layer can be formed by chemical vapor deposition (CVD) or implantation.

In the present invention, a thin semiconductor layer of substantially uniform thickness upon which semiconductor structures can be subsequently formed is fabricated by providing a first wafer comprising a semiconductor substrate (hereinafter referred to as a silicon (Si) substrate); forming an etch stop layer upon the first wafer; forming an epitaxial device layer on the etch stop layer; forming a bonding layer on the device layer; implanting ions into the silicon substrate in order to form a buried layer therein; bonding the bonding layer to a second wafer; heating the bonded first and second wafers; separating the bonded first and second wafers along the buried layer so that the second wafer has a top surface layer comprising Si from the first wafer; and removing the top surface layer and the etch stop layer, whereby underlying portions of the epitaxial device layer remain on the second wafer to form the thin semiconductor layer.

Another embodiment within the scope of this invention includes etching the top surface layer in a first etchant which does not appreciably attack the etch stop layer, and then etching the etch stop layer in a second etchant which does not appreciably attack a remaining part of the epitaxial device layer.

A further embodiment within the scope of this invention includes photolithographically patterning and etching the bonding layer and the epitaxial device layer to form apertures therein after the step of implanting ions.

The foregoing and other aspects of the present invention will become apparent from the following detailed description of the invention when considered in conjunction with the accompanying drawing.

DESCRIPTION OF EXEMPLARY EMBODIMENTS AND BEST MODE

Figure 1:
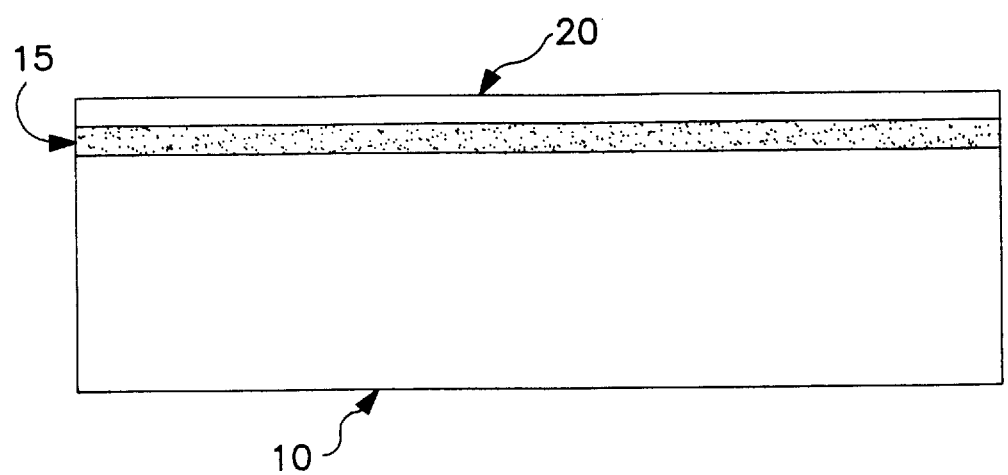
FIG. 1 shows a side view of a conventional SOI wafer.
Figure 2:
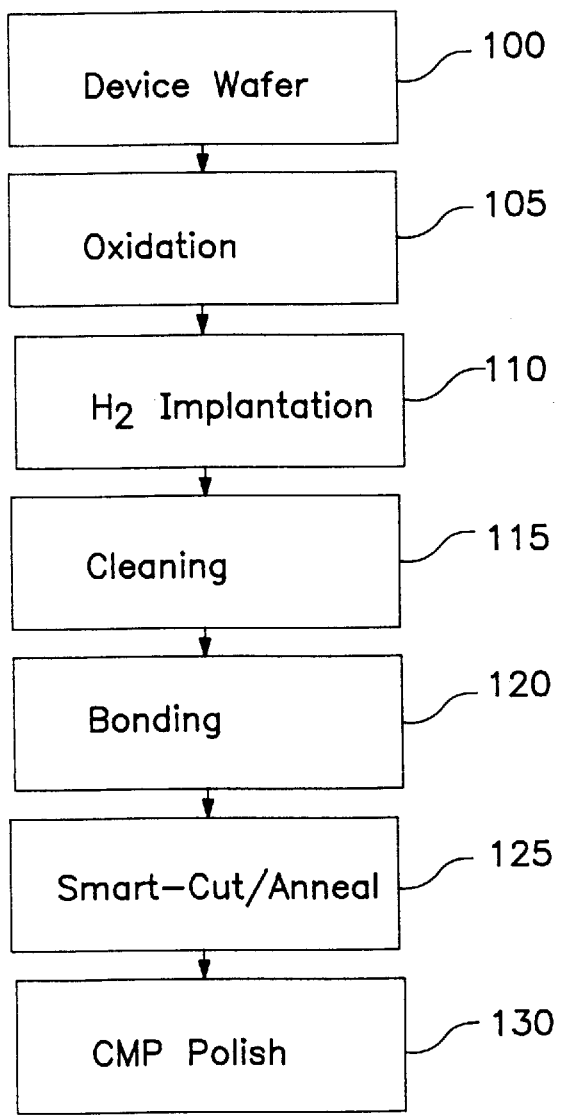
FIG. 2 shows a process flow diagram of a conventional Smart-Cut process.
Figure 3A:
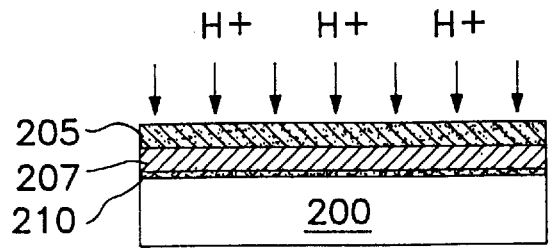
FIGS. 3A to 3C show side views of a conventional wafer as fabricated in accordance with the process of FIG. 2.
Figure 3B:
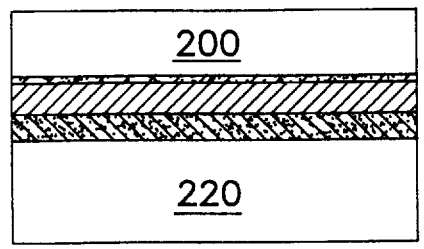
Figure 3C:
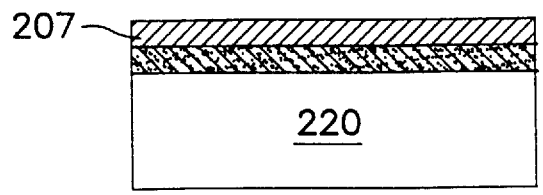

The present invention improves on the Smart-Cut process by using an etch stop layer in conjunction with the Smart-Cut process. Because of the etch stop layer, no chemical-mechanical polishing (CMP) is required after the wafer is split (step 125 in FIG. 2). Thus, the thickness and smoothness of the device layer in the fabricated silicon on insulator (SOI) substrate is determined by the uniformity and smoothness of the deposited layers and wet etch selectivity, as opposed to the CMP parameters. Therefore, the smoothness and uniformity of the device layer are improved.

Figure 4:
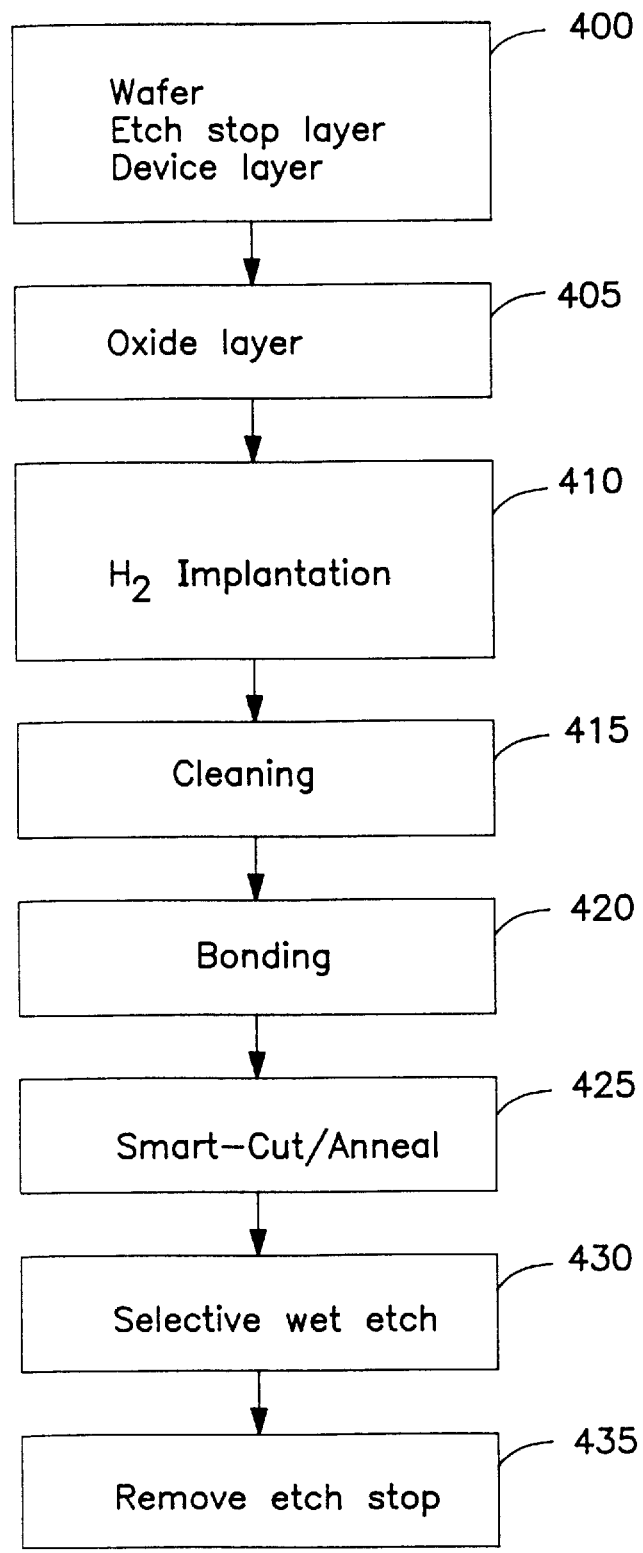
FIG. 4 shows a process flow diagram of an exemplary fabrication process in accordance with the present invention.

FIG. 4 is a flow diagram of one exemplary embodiment of a fabrication process in accordance with the present invention. FIGS. 5A to 5G show the corresponding cross-sections of selected steps from the process flow diagram of FIG. 4. A single crystalline semiconductor wafer 500, preferably a silicon substrate, having a desired orientation is used as the starting point at step 400. The wafer 500 does not have to be device quality because no part of the starting wafer 500 ends up in the final SOI structure. The wafer 500 typically has a low dopant concentration in the range of $10^{15}$ to $10^{18}$ impurities/cm$^3$. A thin etch stop layer 505 having a predetermined composition and thickness is epitaxially grown over the wafer surface. The etch stop layer 505 has a preferred thickness in the range of about $3.9 \times 10^{-7}$ to $7.8 \times 10^{-5}$ inch (100 to 2000 Å), with the most preferred thickness being about $9.8 \times 10^{-7}$ inch (250 Å). The etch stop material is chosen so that it is selective in its etch behavior as compared to the substrate material. For example, a high doped (p+ or n+) silicon layer, a silicon-germanium (Si-Ge) layer, a strained Si-Ge layer, or a Ge layer can be used as an etch stop layer. Preferably, the etch stop layer 505 is a high doped Ge compensated layer of Si-Ge. The dopant concentration is preferably in the range between $10^{20}$ and $10^{21}$ atoms/cm$^3$ of boron. This layer is preferably deposited using a chemical vapor deposition (CVD) process.

Figure 5A:
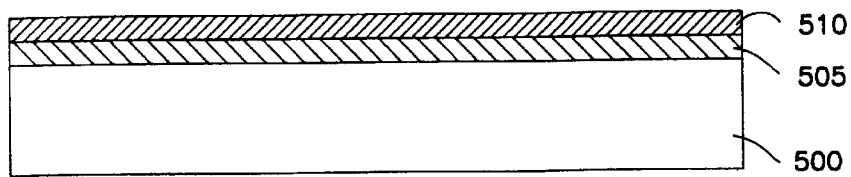
FIGS. 5A to 5G show side views of a wafer as fabricated in accordance with the process of FIG. 4.

A thin device layer 510 having a selected thickness and dopant concentration is then epitaxially deposited over the etch stop layer 505, as shown in FIG. 5A. The choice of etch stop layer 505 should take into account strain mismatch between etch stop layer 505 and device layer 510, so that a good quality low dislocation device layer 510 can be deposited. The device layer 510 can be Si, Si-Ge, Ge, or any other compound semiconductor. Si-Ge layers used in this application may contain 5 to 30 atomic percent Ge. The thickness of the device layer 510 is preferably about $3.9 \times 10^{-6}$ inch (1000 Å) and can range from about $2 \times 10^{-6}$ to $2 \times 10^{-5}$ inch (500 to 5000 Å), depending on the application needs of the device.

Figure 5B:
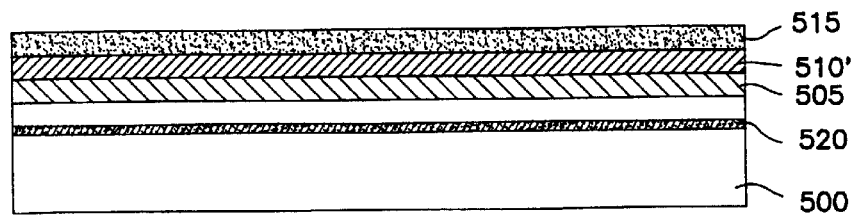

An oxide layer 515 (i.e., a bonding layer or a dielectric layer) is formed on the surface of the device layer 510 at step 405. The bonding layer 515 is preferably formed by thermal oxidation of part of the device layer 510, but high quality deposited oxides (similar to thermal oxide) can also be used. FIG. 5B shows the case when part of the device layer 510 has been converted thermally into an oxide layer 515, with a corresponding reduction in the thickness of layer 510, which is denoted as 510'. A variety of CVD and physical deposition processes are available for deposition of silicon dioxides. In-situ conversion of the device layer 510 to oxide by thermal oxidation can be done by furnace oxidation or rapid thermal oxidation. The combined thickness of the layers 505, 510 and 515 typically ranges from about $0.8 \times 10^{-5}$ to $4 \times 10^{-5}$ inch (2000 Å to 1 μm).

At step 410, hydrogen ions are implanted into the substrate 500 using a dosage of $10^{16}$ to $2 \times 10^{17}$ ions/cm$^2$ at an implantation energy of 50 to 150 KeV. A larger dosage can be used with larger substrates. The hydrogen implantation forms a hydrogen-rich layer 520 at a depth of about $4 \times 10^{-5}$ to $8 \times 10^{-5}$ inch (1 to 2 μm) from the top surface of oxide layer 515. Because the thicknesses of the etch stop layer 505, the device layer 510, and the surface oxide layer 515 are known, the proper implantation voltage can be selected so as to have the peak of the implanted hydrogen occur at the desired depth below the etch stop layer.

A support wafer substrate 530 having a surface oxide layer 535 is provided and both substrates 500 and 530 are cleaned using conventional wet processes, such as the RCA cleaning process, at step 415. Cleaning removes surface impurities and particles from the surfaces of layers 515 and 535. It should be noted that the cleaning and other operations are carried out preferably in clean room conditions to minimize the number of particles landing on the surfaces of layers 515 and 535.

Figure 5C:
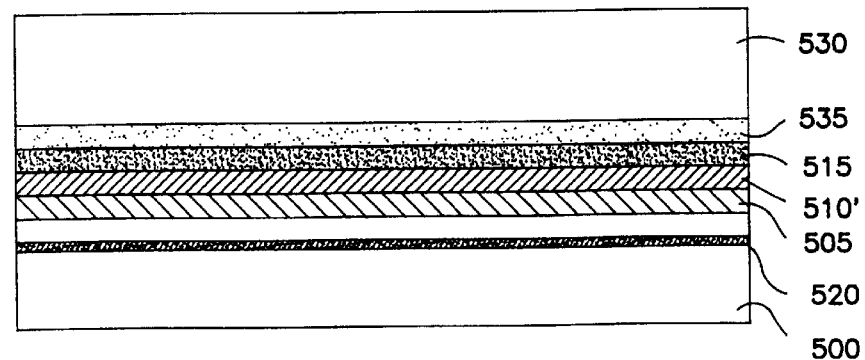
Figure 5D:
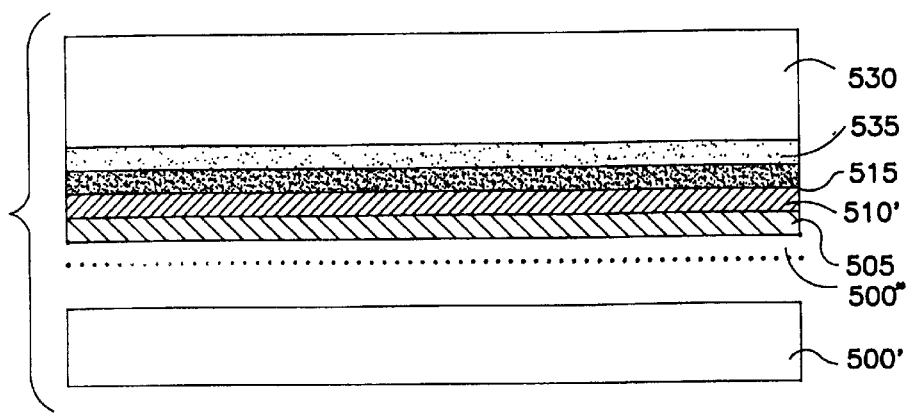
Figure 5E:
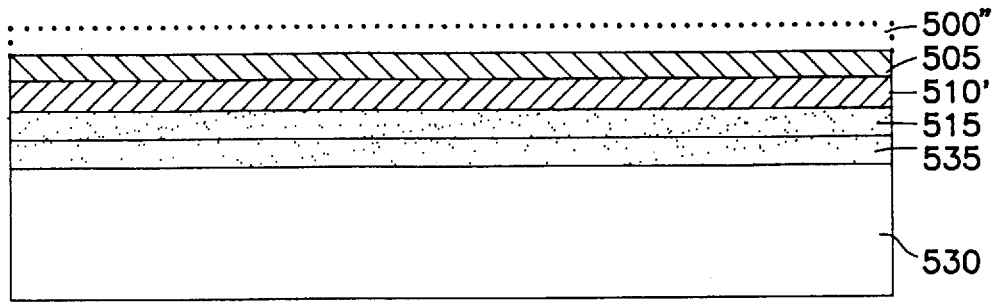
Figure 5F:
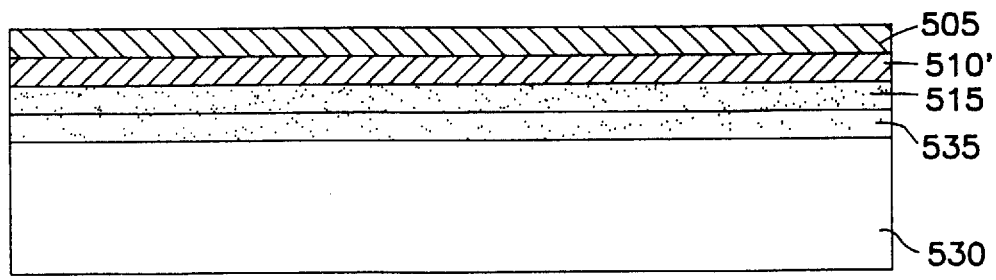

As shown in FIG. 5C and at step 420, the surfaces of layers 515 and 535 are hydrophilic bonded. Hydrophilic bonding is performed by cleaning the exposed surfaces, wetting the surfaces, contacting the surfaces with each other, and compressing the surfaces. The hydrophilic bonding is preferably performed at room temperature. Subsequently, as shown at step 425, the bonded wafers are annealed by heating to a temperature between about 400° and 600° C., with the temperature preferably being about 500° C., for about 30 to 120 minutes. The annealing causes hydride phase formation and linkage of hydride phases, which lead to a fracture or cleaving of the bonded wafers along the layer 520 of the substrate 500, as shown in FIG. 5D. This results in two separate structures: 1) substrate 500', which is essentially the wafer 500, and 2) substrate 530 with a thin top surface layer 500" along with layers 505 and 510' and 515. FIG. 5E shows the arrangement of the SOI wafer after the separating step. The layer 500" has a thickness in the range of about $1 \times 10^{-5}$ to $4 \times 10^{-5}$ inch (2500 Å to 1 μm) based on the implanted depth and thickness of the device, etch stop, and oxide layers.

Then, preferably, the support substrate 530 with the thin silicon layer 510' (device layer) still bonded to it is annealed at a high temperature (approximately 1000° C.) for about 30 minutes to 8 hours to promote a stronger bonding between the support substrate 530 and the device layer 510'.

Figure 5G:
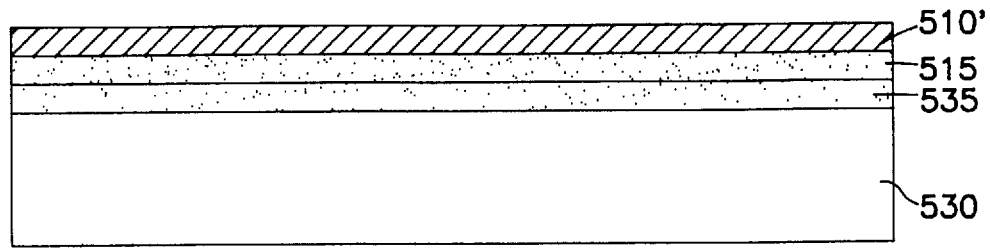

A selective wet etch is performed at step 430 to remove thin top surface layer 500". The etching is stopped by etch stop layer 505. The topography or roughness and nonuniformity of layer 500" is reduced significantly depending on the etch selectivity. A modest selectivity of 10× will reduce the roughness and non-uniformity of the layer 500" by 10× on the etch stop layer 505. For example, a roughness of $7.8 \times 10^{-7}$ to $1.2 \times 10^{-6}$ inch (200 to 300 Å) will be reduced to below $7.8 \times 10^{-8}$ inch (20 Å) on the etch stop surface. Caustic etch solutions such as potassium hydroxide (KOH) or ammonium hydroxide (NH$_4$OH) etch low doped silicon at a rate of 100:1 or greater with respect to high doped Si or Si-Ge (i.e., the etch selectivity is>100:1 for etching low doped substrate ; etch stop layer). The remaining etch stop layer 505 is then removed by a wet or dry etch at step 435. A selective process is preferable, even a selectivity as low as 2× would be beneficial. FIG. 5G shows the completed SOI wafer resulting from the exemplary process, without any polishing operation and wherein the thickness of the device layer is precisely controlled by the deposition uniformity of the device layer and the etch stop layer.

The resulting device layer 510' has a smoothness substantially equal to that of the as-deposited device layer 510 and does not require touch up. Because the etch stop layer 505 and device layer 510 are deposited layers, they have very good uniformity and thickness control across the wafer, which are preserved by this exemplary process.

Figure 6:
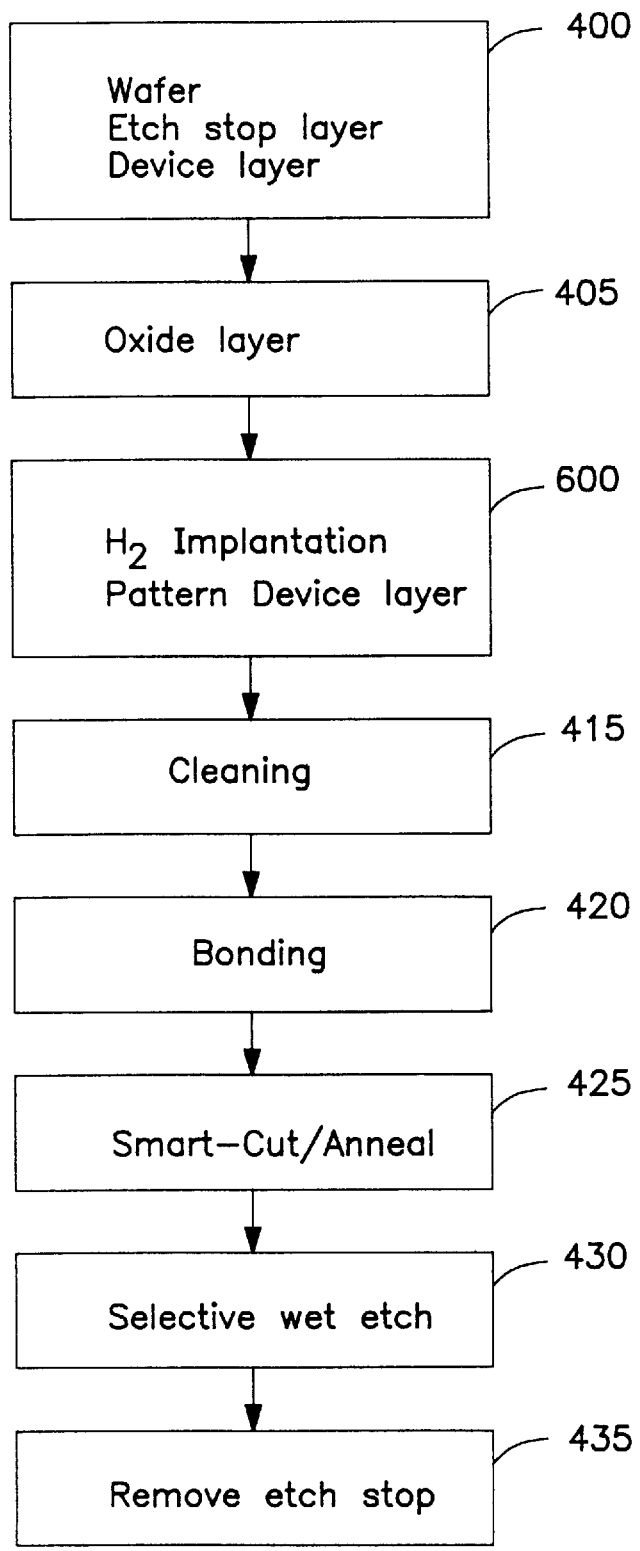
FIG. 6 shows a process flow diagram of a further exemplary fabrication process in accordance with the present invention.

FIG. 6 shows the process flow diagram of another exemplary embodiment of a fabrication process in accordance with the present invention. In FIG. 6, the process steps are similar to those described with respect to FIG. 4, except that an additional process step is used to eliminate problems in bonding. The quality of physical bonding can be adversely affected by the presence of particles on the bonding surfaces, as well as any local wafer warpage. Even with appreciable forces, bringing these surfaces together in intimate contact to establish physical bonding requires high quality surfaces. For example, three to four particles on a wafer can prevent intimate contact of large areas of the wafer.

One way to minimize this problem is to pattern the oxide layer 515 and device layer 510 using photolithography and etching processes into big surface islands or grooves that correspond to each individual chip size. This allows individual particles on the wafer to affect the individual island area it is located on, but not the neighboring islands. This provides the benefit that multiple smaller areas are being attached or bonded instead of one large area. In this way, large areas of device islands can be transferred successfully and used to build devices.

In addition, the depression regions act as a particle trap during cleaning, thus promoting greater yield from the bonding process. Moreover, any local warpage on one of the wafers will result in loss of individual chip locations, but not the entire device layer. FIG. 6 is identical to FIG. 4 in processing steps, except step 410 is replaced with step 600 in which the additional patterning step has been included. The islands or grooves are preferably etched to a depth of about $4 \times 10^{-5}$ to $8 \times 10^{-5}$ inch (1 to 2 μm). Preferably, the grooves are etched through the oxide and device layers, but can also extend into the etch stop layer 505.

The present invention provides an advantageous method for forming thin layers of silicon-germanium (SiGe), Ge, and Si as a sandwich structure on an insulating substrate, as the layers are deposited. For example, if it is desired to form a final structure of Si/SiGe/Si/SiO$_2$, a high doped SiGe etch stop layer is deposited on the device wafer followed by Si/SiGe/Si layers. Part of the top silicon layer can be oxidized to provide the bonding. The other process steps are similar to those described with respect to FIGS. 4 and 6. SiGe device layers are desirable for forming high frequency transistors.

The present invention combines the desirable aspects of the Smart-Cut and the BESOI processes to achieve a thin device SOI layer having a uniformity higher than that obtainable by either of the processes alone. The present invention uses an etch stop layer to eliminate the need for CMP and establish precise control of thickness of the device layer. The uniformity of the device layer is independent of the Smart-Cut process or a CMP process. The present invention preserves the cost advantage of the Smart-Cut process and extends it to more easily and reliably obtain uniform thin device layers The present invention avoids the need for any post-split polishing to obtain an SOI wafer with a smooth and uniform device layer. The present invention overcomes the limitations of the Smart-Cut process and achieves better yields and provides greater control over device layer thickness.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed:

1. A method of forming a thin semiconductor layer of substantially uniform thickness upon which semiconductor structures can be subsequently formed, comprising the steps of:

providing a first wafer comprising a semiconductor substrate;

forming an etch stop layer having a thickness upon said first wafer;

forming a device layer having a thickness on said etch stop layer;

forming a bonding layer on said device layer;

implanting ions into said semiconductor substrate to form a buried layer therein;

bonding said bonding layer to a second wafer;

heating said bonded first and second wafers to a first temperature;

separating said bonded first and second wafers along said buried layer so that said second wafer has a top surface layer; and removing said top surface layer and said etch stop layer, whereby underlying portions of said device layer remain on said second wafer to form the thin semiconductor layer.

2. The method according to claim 1, further comprising the step of heating said second wafer having said top surface layer to a second temperature after said step of separating.

3. The method of claim 2, wherein said step of heating the second wafer includes annealing at about 1000° C. for a time in the range between about 30 minutes and about 8 hours.

4. The method according to claim 1, wherein said semiconductor substrate is a silicon (Si) substrate and said ions comprise hydrogen ions, such that said buried layer is comprised of hydrogen and silicon.

5. The method according to claim 4, wherein said hydrogen ions are implanted at a dose in the range between about $10^{16}$ and $2 \times 10^{17}$ ions/cm$^2$ with an energy in the range between 50 and 150 KeV.

6. The method according to claim 1, wherein said buried layer is formed at a depth between 1 and 2 $\mu$m beneath a top surface of said bonding layer.

7. The method according to claim 1, wherein said step of heating includes annealing at a range between about 400° and 600° C., for a time in the range between about 30 and 120 minutes.

8. The method according to claim 1, wherein said step of bonding said bonding layer to said second wafer comprises hydrophilic bonding.

9. The method according to claim 1, wherein wherein said semiconductor substrate is a Si substrate and said step of bonding said bonding layer to said second wafer comprises the steps of:

forming a layer of silicon dioxide on an exposed surface of said second wafer;

wetting said bonding layer and said silicon dioxide layer;

bringing said bonding layer and said silicon dioxide layer into contact; and compressing said bonding layer and said silicon dioxide layer to form a bond therebetween.

10. The method according to claim 1, wherein said step of removing the top surface layer and said etch stop layer comprises the steps of:

etching the top surface layer in a first etchant which does not appreciably attack said etch stop layer; and etching said etch stop layer in a second etchant which does not appreciably attack a remaining part of said device layer.

11. The method according to claim 10, wherein said first etchant comprises a solution of one of potassium hydroxide and ammonium hydroxide.

12. The method according to claim 1, wherein said step of removing said top surface layer and said etch stop layer comprises removing said top surface layer with a low-selectivity etch having a selectivity of 10:1 or below, followed by removing said etch stop layer with a low selectivity etch of 10:1 or below.

13. The method according to claim 1, wherein said semiconductor substrate is a Si substrate and said etch stop layer comprises one of a high doped Si layer, a silicon-germanium (Si-Ge) layer, a strained Si-Ge layer, a Ge layer, and a Ge compensated layer of Si-Ge.

14. The method according to claim 1, wherein said etch stop layer is doped with boron at a concentration in the range between $10^{20}$ and $10^{21}$ atoms/cm$^3$.

15. The method according to claim 1, wherein the thickness of said etch stop layer is in the range between 100 and 2000 Å.

16. The method according to claim 15, wherein the thickness of said etch stop layer is 250 Å.

17. The method according to claim 1, wherein said step of forming said etch stop layer uses chemical vapor deposition.

18. The method according to claim 1, wherein said semiconductor substrate is a Si substrate and said device layer is one of Si, Ge, and Si-Ge.

19. The method according to claim 18, wherein said device layer is Si-Ge having an atomic percentage of Ge in the range between 5 and 30 percent.

20. The method according to claim 1, wherein said semiconductor substrate is a Si substrate and said device layer comprises at least one of Si, Ge, and Si-Ge.

21. The method according to claim 1, wherein the thickness of the device layer is in the range between 500 and 5000 Å.

22. The method according to claim 21, wherein the thickness of said device layer is 1000 Å.

23. The method according to claim 1, further comprising the steps of photolithographically patterning and etching said bonding layer and said device layer to form apertures therein prior to said step of bonding.

24. The method according to claim 1, wherein the semiconductor substrate comprises silicon.

25. A method for forming a thin silicon on insulator structure, comprising:

providing a first wafer comprising a silicon substrate;

forming an etch stop layer having a thickness upon said first wafer;

forming a device layer having a thickness on said etch stop layer;

forming a bonding layer on said device layer;

implanting hydrogen ions into said silicon substrate to form a buried hydrogen-rich layer therein;

forming a layer of silicon dioxide on an exposed surface of a second wafer;

wetting said bonding layer and said silicon dioxide layer;

bringing said bonding layer and said silicon dioxide layer into contact;

compressing said bonding layer and said silicon dioxide layer to form a hydrophilic bond therebetween;

annealing said bonded first and second wafers at a first temperature;

separating said bonded wafers along said buried hydrogen-rich layer so that said second wafer has a top surface layer comprising Si from said first wafer;

annealing said second wafer having said top surface layer to a second temperature;

etching said top surface layer in a first etchant which does not appreciably attack a remaining part of said etch stop layer; and etching said etch stop layer in a second etchant which does not appreciably attack a remaining part of said device layer;

whereby underlying portions of said device layer remain on the second wafer to form the thin silicon on insulator structure.

* * * * *